(12) United States Patent
Oh

(10) Patent No.: US 9,299,689 B2
(45) Date of Patent: Mar. 29, 2016

(54) METHODS OF FABRICATING SEMICONDUCTOR STACK PACKAGES

(71) Applicant: SK hynix Inc., Icheon-si Gyeonggi-do (KR)

(72) Inventor: Tac Keun Oh, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 52 days.

(21) Appl. No.: 14/337,905

(22) Filed: Jul. 22, 2014

(65) Prior Publication Data

US 2014/0335656 A1 Nov. 13, 2014

Related U.S. Application Data

(62) Division of application No. 13/615,840, filed on Sep. 14, 2012, now abandoned.

(30) Foreign Application Priority Data

Dec. 14, 2011 (KR) .................. 10-2011-0134708

(51) Int. Cl.
*H01L 25/18* (2006.01)
*H01L 25/00* (2006.01)
(Continued)

(52) U.S. Cl.
CPC .............. *H01L 25/50* (2013.01); *H01L 21/561* (2013.01); *H01L 23/3135* (2013.01); *H01L 24/97* (2013.01); *H01L 25/0657* (2013.01); *H01L 24/05* (2013.01); *H01L 24/06* (2013.01); *H01L 24/13* (2013.01); *H01L 24/16* (2013.01); *H01L 24/32* (2013.01); *H01L 24/73* (2013.01); *H01L 24/81* (2013.01); *H01L 25/18* (2013.01); *H01L 2224/0401* (2013.01); *H01L 2224/0557* (2013.01); *H01L 2224/06181* (2013.01); *H01L 2224/12105* (2013.01); *H01L 2224/131* (2013.01); *H01L 2224/13009* (2013.01); *H01L 2224/13022* (2013.01); *H01L 2224/13024* (2013.01); *H01L 2224/13025* (2013.01); *H01L 2224/13144* (2013.01); *H01L 2224/13147* (2013.01); *H01L 2224/16145* (2013.01); *H01L 2224/16235* (2013.01); *H01L 2224/17181* (2013.01); *H01L 2224/29099* (2013.01); *H01L 2224/32145* (2013.01); *H01L 2224/32225* (2013.01); *H01L 2224/73204* (2013.01); *H01L 2224/81191* (2013.01); *H01L 2224/81193* (2013.01); *H01L 2224/81203* (2013.01);
(Continued)

(58) Field of Classification Search
CPC ................................. H01L 25/0657
USPC .............. 257/678, 685, 686, 777, E21.614, 257/E23.085, E25.001, E25.006; 438/109
See application file for complete search history.

(56) References Cited

U.S. PATENT DOCUMENTS

2007/0145556 A1* 6/2007 Bolken ............ H01L 23/3128 257/678
2007/0181991 A1* 8/2007 Ishino ............... H01L 24/73 257/686

*Primary Examiner* — Thomas L Dickey
(74) *Attorney, Agent, or Firm* — William Park & Associates Ltd.

(57) ABSTRACT

Semiconductor chip stacks are provided. The semiconductor chip stack includes a semiconductor chip stack including a plurality of first semiconductor chips vertically stacked on a top surface of the interposer, a second semiconductor chip stacked on a bottom surface of the interposer opposite to the semiconductor chip stack, and an external electrode attached to a top surface of the second semiconductor chip opposite to the interposer. Electronic systems including the semiconductor chip stack and related methods are also provided.

12 Claims, 13 Drawing Sheets

(51) Int. Cl.
  *H01L 23/31* (2006.01)
  *H01L 25/065* (2006.01)
  *H01L 21/56* (2006.01)
  *H01L 23/00* (2006.01)

(52) U.S. Cl.
  CPC ......... *H01L2224/94* (2013.01); *H01L 2224/97* (2013.01); *H01L 2225/06513* (2013.01); *H01L 2225/06517* (2013.01); *H01L 2225/06541* (2013.01); *H01L 2225/06548* (2013.01); *H01L 2225/06572* (2013.01); *H01L 2924/00014* (2013.01); *H01L 2924/12042* (2013.01); *H01L 2924/1431* (2013.01); *H01L 2924/1434* (2013.01); *H01L 2924/157* (2013.01); *H01L 2924/15311* (2013.01); *H01L 2924/181* (2013.01); *H01L 2924/18161* (2013.01); *H01L 2924/3511* (2013.01); *H01L 2924/3512* (2013.01)

METHODS OF FABRICATING SEMICONDUCTOR STACK PACKAGES

CROSS-REFERENCES TO RELATED APPLICATIONS

The present application claims priority under 35 U.S.C 119(a) to Korean Application No. 10-2011-0134708, filed on Dec. 14, 2011, in the Korean Intellectual Property Office, which is incorporated herein by reference in its entirety set forth in full.

BACKGROUND

1. Field of the Invention

Example embodiments of the present disclosure relate to semiconductor packages and, more particularly, to semiconductor stack packages and methods of fabricating the same.

2. Description of the Related Art

Various technologies for producing a large capacity of semiconductor modules and/or a large capacity of semiconductor packages have been continuously developed with requirements for smaller and higher performance electronic products. In response to the above requirements, techniques of vertically stacking a plurality of semiconductor chips, for example, memory chips and/or logic chips have been proposed.

SUMMARY

Example embodiments are directed to semiconductor stack packages and methods of fabricating the same.

Further, embodiments are directed to electronic systems including semiconductor stack packages.

According to some embodiments, a semiconductor stack package includes an interposer, a semiconductor chip stack including a plurality of first semiconductor chips vertically stacked on a top surface of the interposer, a second semiconductor chip stacked on a bottom surface of the interposer opposite to the semiconductor chip stack, and an external electrode attached to a top surface of the second semiconductor chip opposite to the interposer.

According to another embodiment, a semiconductor stack package includes an interposer in which a first through electrode is inserted, a semiconductor chip stack including a plurality of first semiconductor chips vertically stacked on a top surface of the interposer, a second through electrode that penetrates the semiconductor chip stack to be electrically connected to the first through electrode, a second semiconductor chip on a bottom surface of the interposer, and a third through electrode that penetrates the second semiconductor chip to be electrically connected to the first through electrode.

The semiconductor stack package may further include a protection layer covering the semiconductor chip stack.

Each of the plurality of first semiconductor chips may include a memory chip.

The second semiconductor chip may include a logic chip.

The semiconductor stack package may further include a protection layer covering the second semiconductor chip.

According to still another embodiment, a method of fabricating a semiconductor stack package includes, vertically stacking a plurality of first semiconductor chips on a top surface of the interposer to form a semiconductor chip stack, and stacking a second semiconductor chip on a bottom surface of the interposer opposite to the semiconductor chip stack.

The method may further include forming a first through electrode that penetrates a body of the interposer. One end of the first through electrode may be exposed at the top surface of the interposer to constitute a first contact portion, and an other end of the first through electrode may be exposed at the bottom surface of the interposer to constitute a second contact portion.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION OF THE EMBODIMENTS

Figure 1:
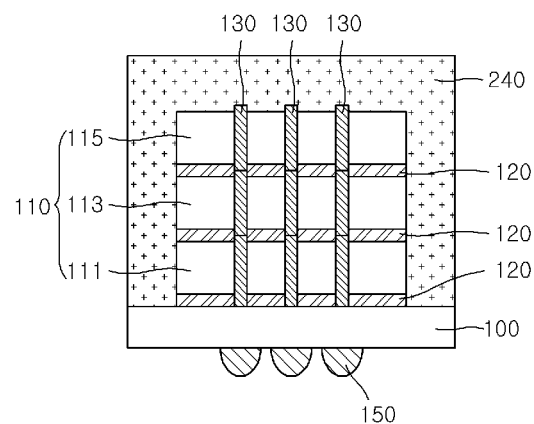
FIG. 1 is a cross sectional view illustrating an example of semiconductor stacked packages.

Example embodiments are described below with reference to the accompanying drawings. Many different forms and embodiments are possible without deviating from the spirit and teachings of this disclosure and so the disclosure should not be construed as limited to the embodiments set forth herein. Rather, these embodiments are provided so that this disclosure will be thorough, and will convey a scope of the disclosure to those skilled in the art. In the drawings, the sizes and relative sizes of layers and regions may be exaggerated for clarity. The same reference numerals or the same reference designators denote the same elements throughout the specification.

Example embodiments are described herein with reference to cross-section illustrations that are schematic illustrations of embodiments (and intermediate structures). As such, variations from the shapes of the illustrations as a result, for example, of manufacturing techniques and/or tolerances, are to be expected. Thus, the disclosed embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "has", "having", "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross sectional view illustrating an example of semiconductor stacked packages.

Referring to FIG. 1, a semiconductor stack package may be realized by vertically stacking a plurality of semiconductor chips on a package substrate 100, for example, a printed circuit board (PCB). The plurality of semiconductor chips may include a first semiconductor chip 111, a second semiconductor chip 113 and a third semiconductor chip 115 which are sequentially stacked. An under fill material 120 (or an adhesive agent) may be disposed between the stacked semiconductor chips 111, 113 and 115 as well as between the first semiconductor chip 111 and the package substrate 100. The plurality of stacked semiconductor chips 111, 113 and 115 may constitute a semiconductor chip stack 110. Internal circuits of the plurality of stacked semiconductor chips 111, 113 and 115 may be electrically connected to each other by through electrodes 130, for example, through silicon vias (TSVs) that penetrate the stacked semiconductor chips 111, 113 and 115. After the semiconductor chip stack 110 are mounted on the package substrate 100, a molding member 140 such as an epoxy molding compound (EMC) may be formed to cover the semiconductor chip stack 110. Subsequently, external electrodes 150, for example, solder balls may be formed on a bottom surface of the package substrate 100 opposite to the semiconductor chip stack 110, thereby realizing the semiconductor stack package.

According to the semiconductor stack package illustrated in FIG. 1, the semiconductor chip stack 110 is mounted on the package substrate 100. Thus, there may be some limitations in further interposing an additional semiconductor chip between the semiconductor chip stack 110 and the package substrate 100. In the event that an additional semiconductor chip is disposed between the semiconductor chip stack 110 and the package substrate 100, the semiconductor chip stack 110 should be stacked on the additional semiconductor chip after the additional semiconductor chip is mounted on the package substrate 100. However, in this case, a complicated process may be required and an accurate control process may also be required.

FIGS. 2 to 12 are cross sectional views illustrating methods of fabricating semiconductor stack packages according to some embodiments and semiconductor stack packages fabricated thereby. For the purpose of ease and convenience in explanation, the present embodiment will be described in conjunction with an example a semiconductor chip stack comprising three semiconductor chips. However, the number of the semiconductor chips constituting the semiconductor chip stack is not limited to three. For example, the number of the semiconductor chips constituting the semiconductor chip stack may be four, eight or more.

Figure 2:
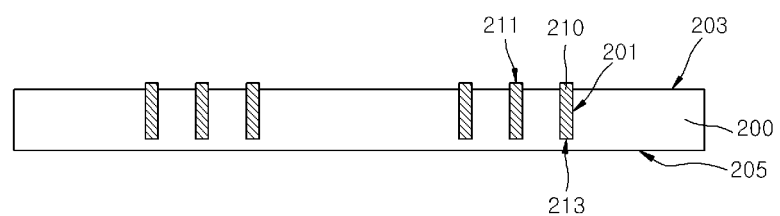
FIGS. 2 to 12 are cross sectional views illustrating methods of fabricating semiconductor stack packages according to some example embodiments and semiconductor stack packages fabricated thereby.

Referring to FIG. 2, an interposer 200 may be used as a handling member of one or more semiconductor chip stacks during a packaging process. In the present embodiment, the interposer 200 will be described to be a non-flexible substrate on which the semiconductor chip stacks are mounted. However, in some embodiments, the interposer 200 may be a film-shaped substrate, a tape-shaped substrate or a sheet-shaped substrate.

The interposer 200 may be a semiconductor substrate (e.g., a silicon substrate or a germanium substrate) or an insulator substrate (e.g., a carbon polymer substrate, a glass fiber substrate or a resin substrate). In some other embodiments, the interposer 200 may be a metal substrate. In some other embodiments, the interposer 200 may include an insulator substrate and conductive circuit interconnections disposed in or on the insulator substrate. The conductive circuit interconnections may be formed of iron, copper, nickel or gold. When the interposer 200 is a semiconductor substrate, an insulation layer such as an oxide material may be coated on a surface of the semiconductor substrate to electrically insulate the semiconductor substrate from other elements. When the interposer 200 is a metal substrate, an insulation layer may also be coated on a surface of the metal substrate to electrically insulate the metal substrate from other elements.

When the interposer 200 and semiconductor chips stacked on the interposer 200 include the same material (e.g., a silicon material), a coefficient of thermal expansion (CTE) of the interposer 200 may be equal or similar to that of the semiconductor chips on the interposer 200. Thus, a mechanical stress and/or a physical stress generated between the interposer 200 and the semiconductor chips on the interposer 200 can be alleviated or prevented. Accordingly, even though a temperature of the interposer 200 and the semiconductor chips stacked on the interposer 200 is varied, it may be that cracks do not form in the interposer 200 and/or the semiconductor chips. Further, a silicon material exhibits excellent heat conductivity. Thus, in some embodiments, the interposer 200 may include a silicon material.

The interposer 200 may be etched to form grooves 201 that extend from a top surface 203 of the interposer 200 into a bulk region of the interposer 200. The grooves 201 may be formed using a wet etching process, a dry etching process, a laser drilling process or a micro drilling process. A depth of the grooves 201 may vary depending on a final thickness of the interposer 200 remaining after formation of the semiconductor stack package. In some embodiments, the grooves 201 may be formed to reach a bottom surface 205 of the interposer 200. That is, the grooves 201 may correspond to through holes that completely penetrate the interposer 200. However, while a relatively thick interposer 200 is helpful in handling semiconductor chips mounted on the interposer 200 during a packaging process, a relatively thin interposer 200 may be advantageous to the semiconductor stack package. Hence, in some embodiments, a depth of the grooves 201 may be less than an initial thickness of the interposer 200, as illustrated in FIG. 2.

A conductive layer may fill the grooves 201, thereby forming first through electrodes 210 in respective ones of the grooves 201. The first through electrodes 210, for example, through silicon vias (TSVs) may act as electrical contact structures.

The conductive layer filling the grooves 201 may include a metallic material, a doped polysilicon material or a carbon nanotube (CNT) material. The metallic material may include aluminum (Al), iron (Fe), copper (Cu), nickel (Ni), gold (Au) or metal alloy thereof. In addition, an insulation layer (not shown) such as a silicon oxide material may be disposed between the first through electrodes 210 and the interposer 200. The insulation layer may be formed to prevent the first through electrodes 210 from being electrically connected to the interposer 200. If the interposer 200 is an insulator substrate, forming the insulation layer between the first through electrodes 210 and the interposer 200 may be omitted.

A top portion of each of the first through electrodes 210 may correspond to a first contact portion 211 and may be adjacent to the top surface 203 of the interposer 200. That is, the first contact portions 211 of the first through electrodes 210 may be exposed at the top surface 203 of the interposer 200. In some embodiments, the first contact portions 211 of the first through electrodes 210 may upwardly protrude from the top surface 203 of the interposer 200. Having the first contact portions 211 protrude from the top surface 203 may improve the reliability of electrical and physical connections between the first contact portions 211 and other elements.

Lower portions of the first through electrodes 210 may correspond to second contact portions 213 and may be electrically connected to external devices in a subsequent process. In the present embodiment, the second contact portions 213 of the first through electrodes 210 may be buried in lower regions of the grooves 201 as illustrated in FIG. 2. However, if the grooves 201 are formed to have a through hole shape penetrating the interposer 200, the second contact portions 213 may be exposed at the bottom surface 205 of the interposer 200. The first through electrodes 210 may be formed to include a plurality of groups in consideration of electrical connection to a plurality of semiconductor chip stacks which are formed in a subsequent process.

Figure 3:
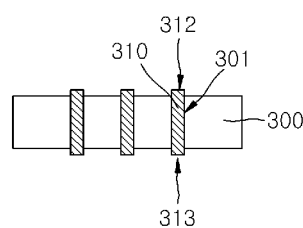

Referring to FIG. 3, a plurality of first semiconductor chips 300 may be prepared. The first semiconductor chips 300 may be stacked on the interposer 200, which is described with reference to FIG. 2, in a subsequent process. For the purpose of simplification in illustration, only one of the plurality of the first semiconductor chips 300 is illustrated in FIG. 3.

The first semiconductor chips 300 may be volatile memory chips, for example, dynamic random access memory (DRAM) chips. However, the first semiconductor chips 300 are not limited to volatile memory chips. For example, the first semiconductor chips 300 may be non-volatile memory chips (e.g., flash memory chips), logic chips including various logic circuits, or communication chips for network communication. The present embodiment will be described in conjunction with DRAM chips as an example of the first semiconductor chips 300.

Second through electrodes 310 may be formed to penetrate each of the first semiconductor chips 300. The second through electrodes 310 may act as electrical contact structures that electrically connect the first semiconductor chips 300 to other chips or other substrates. Active regions (not shown) may be formed in a top surface of the first semiconductor chips 300 and integrated circuits may be formed in and on the active regions. The second through electrodes 310 may be electrically connected to the integrated circuits of the first semiconductor chips 300. The second through electrodes 310 may be electrically connected to the integrated circuits of the first semiconductor chips 300 by redistributed interconnections (not shown). The second through electrodes 310 may be formed in respective ones of first through holes 301 penetrating the first semiconductor chips 300. That is, the second through electrodes 310 may be formed by filling the first through holes 301 with a conductive material. These second through electrodes 310 may be fabricated using a technique for forming through silicon vias (TSVs). The second through electrodes 310 may be formed of a conductive material, for example, a metallic material, a doped polysilicon material or a carbon nanotube (CNT) material. The metallic material may include aluminum (Al), iron (Fe), copper (Cu), nickel (Ni), gold (Au) or metal alloy thereof.

Each of the second through electrodes 310 may include a third contact portion 312 and a fourth contact portion 313 at both ends thereof, respectively. The third and fourth contact portions 312 and 313 may be electrically connected to other elements. The third and fourth contact portions 312 and 313 may be exposed at top and bottom surfaces of the first semiconductor chips 300. In some embodiments, the third and fourth contact portions 312 and 313 may protrude from the top and bottom surfaces of the first semiconductor chips 300. Having the third and fourth contact portions 312 and 313 protrude from the top and bottom surfaces may improve the reliability of electrical and physical connections between the third and fourth contact portions 312 and 313 and other elements. Moreover, each of the third and fourth contact portions 312 and 313 may be covered with a gold stud bump (GSB), a copper pillar bump (CPB) or a solder bump.

Figure 4:
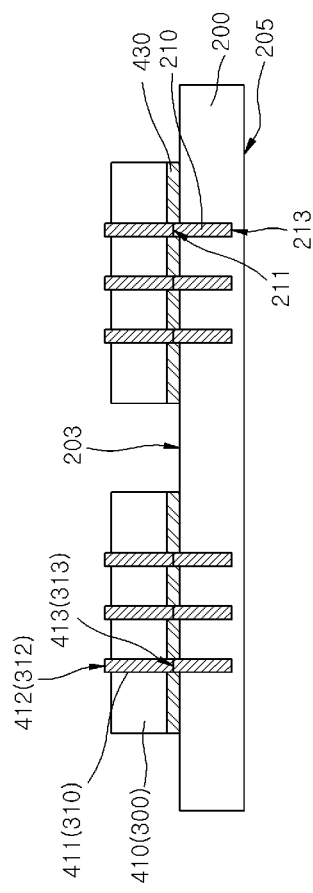

Referring to FIG. 4, a pair of first chips 410 among the first semiconductor chips 300 described with reference to FIG. 3 may be stacked on the top surface 203 of the interposer 200 illustrated in FIG. 2. One of the pair of first chips 410 may be stacked on a first group of through electrodes 210 among the first through electrodes 210, and the other of the pair of first chips 410 may be stacked on a second group of through electrodes 210 among the first through electrodes 210. Although the following embodiment is described in conjunction with an example in which the same chips as the first semiconductor chips 300 are vertically stacked on the interposer 200, the inventive concept may also be applied to other examples where different chips in function and/or in size may be vertically stacked on the interposer 200.

Further, even though the terms "a first chip 410 of the first semiconductor chips 300", "a second chip 450 of the first semiconductor chips 300", "a third chip 470 of the first semiconductor chips 300", etc., are used hereinafter to distinguish from each other, the first chip 410, the second chip 450 and the third chip 470 may have the same configuration as the first semiconductor chip 300 described with reference to FIG. 3. Even though the terms "a first portion 411 of the second through electrode", "a second portion 451 of the second through electrode", "a third portion 471 of the second through electrode", etc., are used hereinafter to distinguish, the first portion 411, the second portion 451 and the third portion 471, which may have the same configuration as the second through electrode 310 described with reference to FIG. 3. That is, each of the first portion 411, the second portion 451 and the third portion 471 may include a third contact portion 412 corresponding to the third contact portion 312 of the second through electrode 310 illustrated in FIG. 3, and a fourth contact portion 413 corresponding to the fourth contact portion 313 of the second through electrode 310 illustrated in FIG. 3.

Referring again to FIG. 4, a pair of first chips 410 may be stacked on the top surface 203 of the interposer 200 such that first portions 411 of second through electrodes penetrating the first chips 410 are electrically connected to respective ones of the first through electrodes 210 disposed in the interposer 200. The first chips 410 may be disposed to be spaced apart from each other when viewed from a plan view. Third contact portions 412 of the first portions 411 may be exposed at top surfaces of the first chips 410, and fourth contact portions 413 of the first portions 411 may be electrically connected to respective ones of the first contact portions 211 of the first through electrodes 210. A first intermediate insulation layer 430 may be disposed between the interposer 200 and the first chips 410. The first intermediate insulation layer 430 may act as an adhesive agent and may also electrically insulate the first chips 410 from the interposer 200.

The first intermediate insulation layer 430 may include an under fill layer (e.g., a resin layer), a non-conductive film (NCF), a non-conductive paste (NCP), an anisotropic conductive film (ACF) or an anisotropic conductive paste (ACP).

Figure 5:
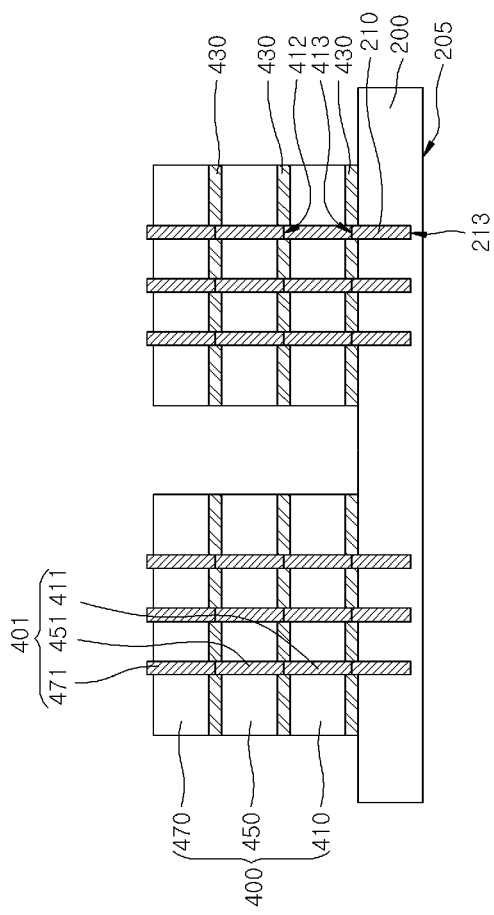

Referring to FIG. 5, second chips 450 may be stacked on respective ones of the first chips 410, and third chips 470 may be stacked on respective ones of the second chips 450. Other first intermediate insulation layers 430 may also be disposed between the first chips 410 and the second chips 450 as well as between the second chips 450 and the third chips 470. While the second chips 450 and the third chips 470 are stacked on the first chips 410, second portions 451 penetrating the second chips 450 may be vertically aligned with respective ones of the first portions 411 and third portions 471 penetrating the third chips 470, and the third portions 471 may also be vertically aligned with respective ones of the second portions 451. Accordingly, the second portions 451 may be electrically connected with respective ones of the first portions 411, and the third portions 471 may be electrically connected with respective ones of the second portions 451.

A set of the first chip 410, the second chip 450 and the third chip 470 sequentially and vertically stacked may constitute a semiconductor chip stack 400. Accordingly, in the present embodiment, a pair of semiconductor chip stacks 400 may be disposed on the interposer 200 such that the pair of semiconductor chip stacks 400 are laterally spaced apart from each other, as illustrated in FIG. 5. Although, the depicted embodiment shows a pair of semiconductor chip stacks 400 on the interposer 200, in other embodiments more than a pair of semiconductor chip stacks 400 may be disposed on the interposer 200. Further, a set of the first portion 411, the second portion 451 and the third portion 471 vertically stacked may constitute a single second through electrode 401 that completely penetrates the semiconductor chip stack 400. In each second through electrode 401, a connection member (not shown) such as a bump may be disposed between the first portion 411 and the second portion 451 as well as between the second portion 451 and the third portion 471. Similarly, another connection member may also be disposed between the first through electrodes 210 and the first portions 411. The connection members may improve the reliability of electrical connections between the first portions 411 and the second portions 451, between the second portions 451 and the third portions 471, and between the first through electrodes 210 and the first portions 411. In some embodiments, when an anisotropic conductive layer such as an anisotropic conductive film (ACF) or an anisotropic conductive paste (ACP) is used as the first intermediate insulation layer 430, connection members such as bumps may not be needed.

Figure 6:
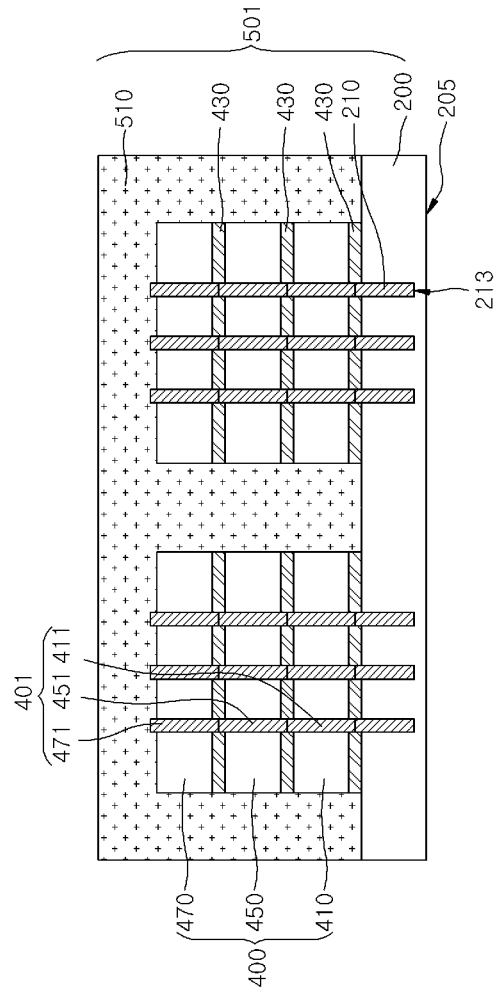

Referring to FIG. 6, a first protection layer 510 may be formed to cover the semiconductor chip stacks 400. The first protection layer 510 may be formed to protect the semiconductor chip stacks 400 from an external environment. The first protection layer 510 may fill a space between the semiconductor chip stacks 400, thereby covering all the sidewalls of the semiconductor chip stacks 400. The first protection layer 510 may be formed of an epoxy molding compound (EMC) material using a first molding process. In some embodiments, the first protection layer 510 may be formed to include a thermoset resin material, a silica material or a non-conductive filler material. In other embodiments, the first protection layer 510 may be formed to include an insulating resin material, a non-conductive film (NCF), a non-conductive paste (NCP), an anisotropic conductive film (ACF) or an anisotropic conductive paste (ACP).

In some embodiments, the first protection layer 510 may be formed to leave exposed top surfaces of the semiconductor chip stacks 400 and to cover sidewalls of the semiconductor chip stacks 400. The first protection layer 510 may protect the semiconductor chip stacks 400 even when subsequent processes are performed. Thus, the first protection layer 510 may also be formed to completely cover all the surfaces of the semiconductor chip stacks 400.

When the semiconductor chip stacks 400 are completely covered with the first protection layer 510, the interposer 200, the semiconductor chip stacks 400 and the first protection layer 510 may act as a chip stack substrate 501 having a semi-finished product shape. Accordingly, at least one additional semiconductor chip may be mounted on the chip stack substrate 501.

The chip stack substrate 501 may be thicker than the interposer 200 and/or each semiconductor chip stack 400 because the chip stack substrate 501 includes the first protection layer 510 in addition to the interposer 200 and the semiconductor chip stacks 400. Further, the chip stack substrate 501 may have a relatively high strength because of the presence of the first protection layer 510. Thus, even though subsequent processes are performed using the chip stack substrate 501, the first protection layer 510 may suppress or prevent process defects (e.g., warpage of the chip stack substrate 501 and/or cracks in the chip stack substrate 501) from occurring or being generated. Moreover, all the surfaces of the semiconductor chip stacks 400 may be covered with the first protection layer 510 and the bottom surface 205 of the interposer 200 opposite to the semiconductor chip stacks 400 may remain exposed, as illustrated in FIG. 6. Thus, various processes can be additionally applied to the exposed bottom surface 205 of the interposer 200 without any damage occurring to the semiconductor chip stacks 400. For example, additional semiconductor chips can be stacked on the exposed bottom surface 205 of the interposer 200 without any damage occurring to the semiconductor chip stacks 400. That is, a process margin can be improved while the additional processes are performed.

Figure 7:
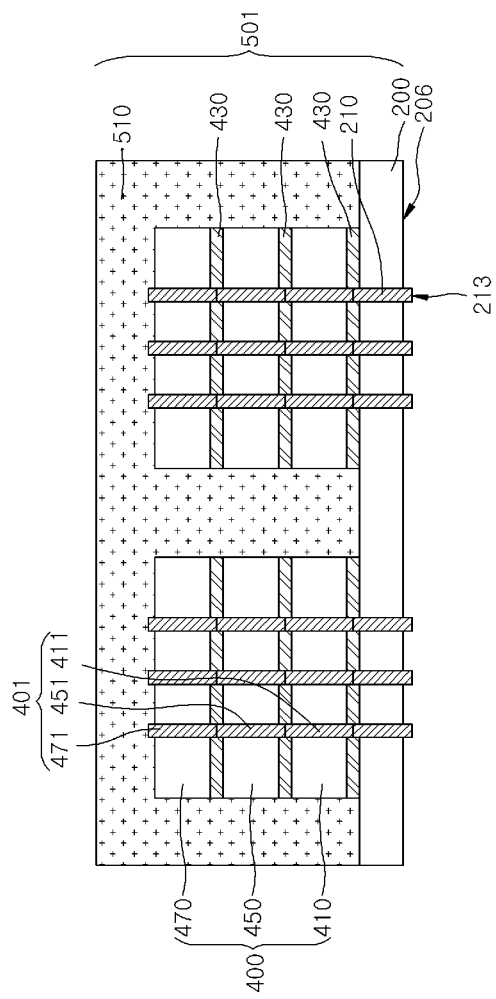

Referring to FIG. 7, the bottom surface 205 (see for, example, FIG. 4 for view of an un-recessed bottom surface) of the interposer 200 may be recessed to remove a lower portion of the interposer 200. The first protection layer 510 may be formed to cover the semiconductor chip stacks 400 before the bottom surface, i.e., lower portion, of the interposer 200 is recessed. As a result, the second contact portions 213 of the first through electrodes 210 may be exposed by a recessed bottom surface 206 opposite to the first contact portion 211 (see FIG. 2). After removal of the lower portion of the interposer 200, the second contact portions 213 of the first through electrodes 210 may downwardly protrude from the recessed bottom surface 206 of the interposer 200. Even though a thickness of the interposer 200 is reduced due to removal of the lower portion of the interposer 200, the chip stack substrate 501 may still have a relatively high strength because of the presence of the first protection layer 510. In some embodiments, the bottom surface 205 and/or the recessed bottom surface 206 is not covered by the first protection layer 510. Thus, when additional semiconductor chips are stacked on the recessed bottom surface 206 of the interposer 200, the first semiconductor chips 410, 450 and 470 may be damaged.

In some embodiments, the bottom surface 205 of the interposer 200 may be recessed using a grinding process, a chemical mechanical polishing (CMP) process or an etch back process. The etch back process may be performed using a dry etching process or a wet etching process.

Figure 8:
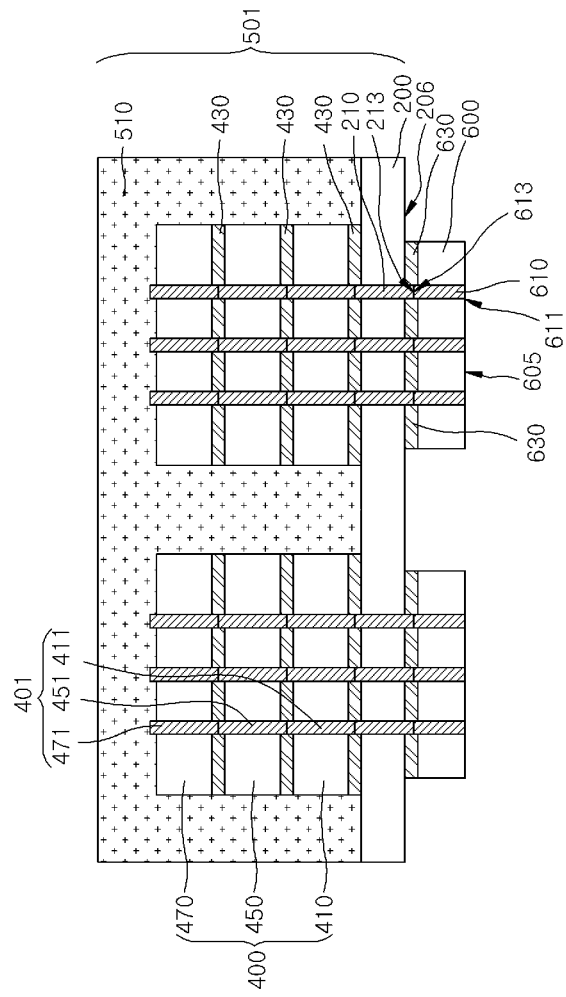

Referring to FIG. 8, second semiconductor chips 600 may be stacked on the recessed bottom surface 206 of the interposer 200 opposite to the semiconductor chip stacks 400, where opposite to the semiconductor chip stacks 400 means that each column of second semiconductor chips 600 are arranged underneath (or above depending on the viewpoint) each of the semiconductor chip stacks 400. When the first semiconductor chips 410, 450 and 470 constituting the semiconductor chip stacks 400 are memory chips such as DRAM chips, the second semiconductor chips 600 may be control chips or logic chips that control the operation of the memory chips. In some embodiments, the first and second semiconductor chips 410, 450, 470 and 600 may be the same kind of chips but differ from each other in size.

Each of the second semiconductor chips 600 may include fifth contact portions 611 adjacent to top surfaces 605 thereof and sixth contact portions 613 adjacent to bottom surfaces thereof opposite to the top surfaces 605. The fifth contact portions 611 may be electrically connected to an external device, and the sixth contact portions 613 may be electrically connected to the first semiconductor chips 410, 450 and 470. The fifth and sixth contact portions 611 and 613 may have connection pad shapes. Alternatively, the fifth contact portions 611 may correspond to first ends of third through electrodes 610 penetrating the second semiconductor chips 600, and the sixth contact portions 613 may correspond to second ends of the third through electrodes 610 penetrating the second semiconductor chips 600. FIG. 8 illustrates an example wherein the fifth contact portions 611 and the sixth contact portions 613 correspond to the first ends and the second ends of the third through electrodes 610 penetrating the second semiconductor chips 600. However, in some embodiments, connection pads may be disposed on the top and bottom surfaces of the second semiconductor chips 600, and the connection pads may be directly connected to the fifth and sixth contact portions 611 and 613 of the third through electrodes 610 or may be indirectly connected to the fifth and sixth contact portions 611 and 613 via redistributed interconnections (not shown).

The second semiconductor chips 600 may be stacked on the recessed bottom surface 206 of the interposer 200, as described above. Specifically, the second semiconductor chips 600 may be disposed on the recessed bottom surface 206 of the interposer 200, and the sixth contact portions 613 may be connected to and combined with the second contact portions 213 of the first through electrodes 210 by applying heat and pressure to the second and sixth contact portions 213 and 613. The second semiconductor chips 600 may be directly mounted on the chip stack substrate 501 including the interposer 200. Thus, the second semiconductor chips 600 may be mounted on the chip stack substrate 501 using the same or similar technique as a chip on wafer (COW) bonding process. According to the present embodiment, even though the second semiconductor chips 600 are mounted on the recessed bottom surface 206 of the interposer 200, the second semiconductor chips 600 may be electrically connected to the semiconductor chip stacks 400 mounted on the top surface of the interposer 200 opposite to the recessed bottom surface 206, where the second semiconductor chips 600 may be electrically connected with the semiconductor chip stacks 400 by the first through electrodes 210 penetrating the interposer 200.

Figure 9:
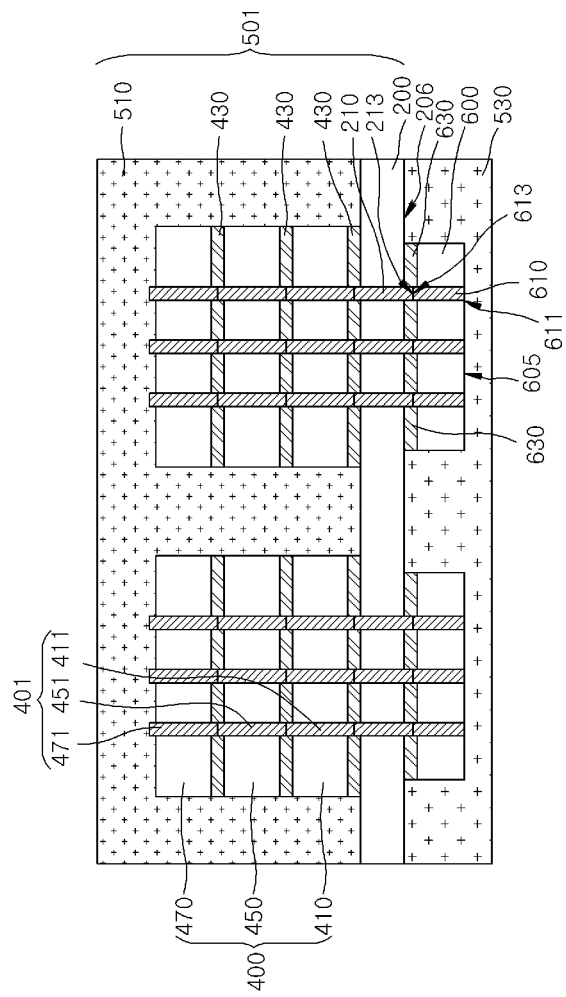

Referring to FIG. 9, a second protection layer 530 may be formed on the recessed bottom surface 206 of the interposer 200 to cover the second semiconductor chips 600. The second protection layer 530 may be formed using a second molding process. The second molding process may be substantially the same or similar to the first molding process used in formation of the first protection layer 510. While the second protection layer 530 is formed, the chip stack substrate 501 may act as a substrate supporting the second semiconductor chips 600. During the second molding process, the semiconductor chip stacks 400 may be undamaged because the semiconductor chip stacks 400 is covered with the first protection layer 510.

The second protection layer 530 may be formed to cover the fifth contact portions 611 that electrically connect the second semiconductor chips 600 to an external device, as illustrated in FIG. 9. However, in some embodiments, the second protection layer 530 may be formed to cover sidewalls of the second semiconductor chips 600 and to expose the fifth contact portions 611 and the top surfaces 605 of the second semiconductor chips 600. That is, the second protection layer 530 illustrated in FIG. 9 may be additionally planarized to expose the fifth contact portions 611 and the top surfaces 605 of the second semiconductor chips 600.

Figure 10:
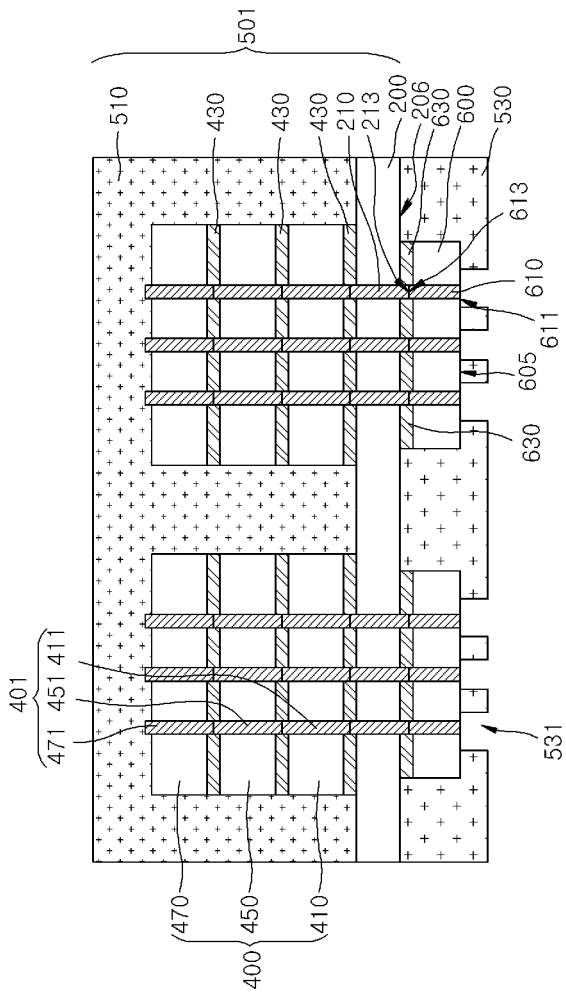

Referring to FIG. 10, the second protection layer 530 illustrated in FIG. 9 may be patterned to form openings 531 that selectively expose the fifth contact portions 611. The openings 531 may be formed by selectively removing some portions of the second protection layer 530 using a selective etching process or a drilling process. The drilling process may include a laser drilling process or a micro drilling process.

Figure 11:
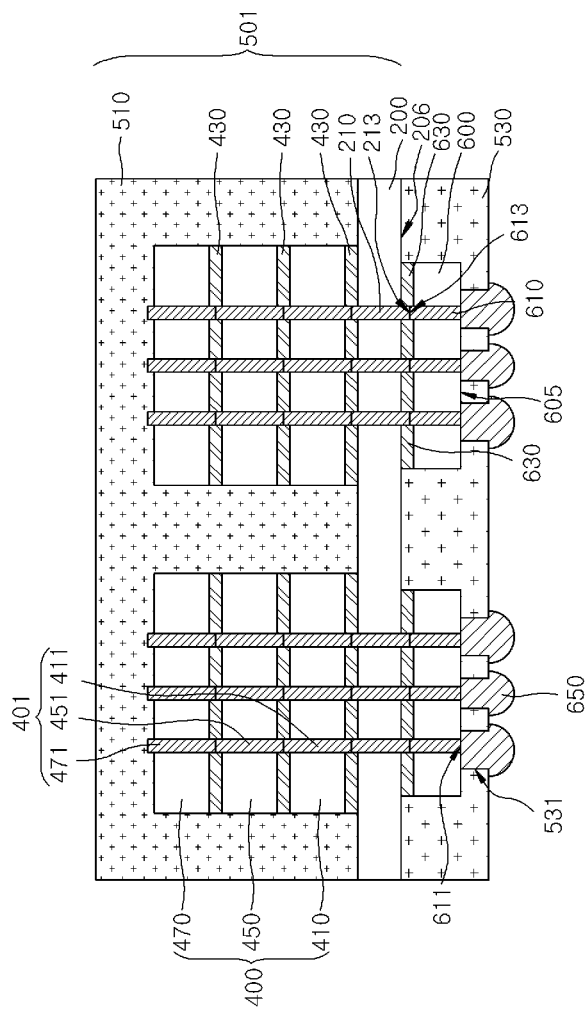

Referring to FIG. 11, external electrodes 650 may be formed on respective ones of the fifth contact portions 611 exposed by the openings 531. The fifth contact portions 611 may correspond to end portions of the third through electrodes 610. However, in the event that redistributed interconnections (not shown) electrically connected to the fifth contact portions 611 are employed, forming the openings 531 may expose some portions of the redistributed interconnections and the external electrodes 650 may be formed on the exposed portions (corresponding to connection pads) of the redistributed interconnections. The external electrodes 650 may be formed to have solder ball shapes, solder bump shapes, conductive plate shapes or interconnection line shapes.

Figure 12:
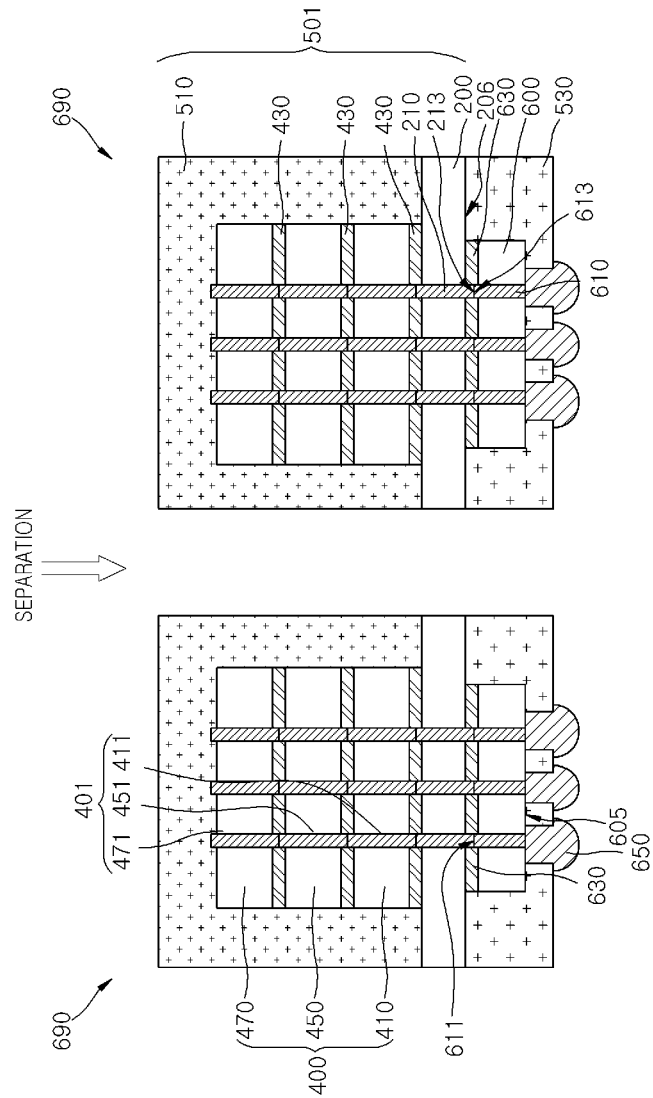

Referring to FIG. 12, after formation of the second protection layer 530 and the external electrodes 650, the first protection layer 510 between the semiconductor chip stacks 400, a portion of the interposer 200, and the second protection layer 530 between the second semiconductor chips 600 may be selectively removed to separate the semiconductor chip stacks 400 and the second semiconductor chips 600 into a plurality of discrete semiconductor stack packages 690. The separation process may be performed by a sawing technique that uses a diamond blade or a laser.

Each of the semiconductor stack packages 690 according to embodiments described with reference to FIGS. 2 to 12 may be configured to include one of the semiconductor chip stacks 400, one of the second semiconductor chips 600 and the interposer 200 therebetween, as illustrated in FIG. 12. In each semiconductor stack package 690, the first through electrodes 210 penetrating the interposer 200 may be electrically connected to respective ones of the second through electrodes 401 penetrating the semiconductor chip stack 400 and the first through electrodes 210 may be electrically connected to respective ones of the sixth contact portions 613 of the second semiconductor chip 600. The fifth contact portions 611 of the second semiconductor chip 600 may be electrically connected to the external electrodes 650. The semiconductor chip stack 400 may include a plurality of stacked semiconductor chips (e.g., a plurality of stacked memory chips) having a high integration density and a large capacity of data, and the second semiconductor chip 600 mounted on the interposer 200 as a single chip, may be a logic chip (e.g., a controller chip) having a relatively high signal processing speed.

If the semiconductor chip stack 400 includes a plurality of stacked memory chips and the second semiconductor chip 600 is a logic chip, the logic chip may be disposed closer to the external electrodes 650 than a distance between the semiconductor chip stack 400 and the external electrode 650. This positioning of the logic chip which may assist in terms of operation speed and reliability of the semiconductor stack package 690. Accordingly, when the semiconductor chips 111, 113 and 115 are memory chips and are stacked only on one surface of the substrate 100 as illustrated in FIG. 1, the logic chip may be employed as a lowermost chip of the semiconductor chip stack 110 to improve operation speed and reliability of the semiconductor stack package 690. In this case, as illustrated in FIG. 13, a logic chip 20 and a plurality of memory chips 31 may be sequentially stacked.

Figure 13:
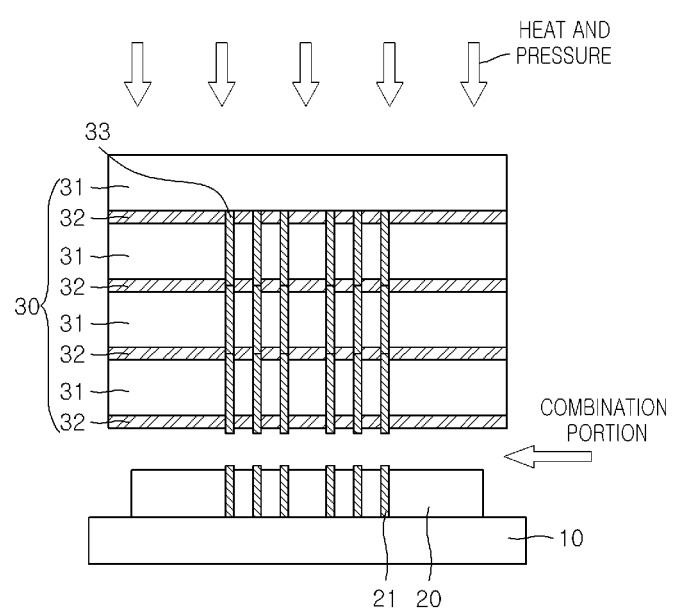
FIG. 13 is a cross sectional view illustrating a semiconductor stack package of a comparative example to describe advantages of semiconductor stack packages according to some embodiments and fabrication methods thereof.

Referring to FIG. 13, the logic chip 20 having first through electrodes 21 may be stacked on a substrate 10 for relatively fast data communication with external electrodes (not shown) such as solder balls that are attached to a bottom surface of the substrate 10 opposite to the logic chip 20. In this case, the plurality of memory chips 31 may be stacked on the logic chip 20 opposite to the substrate 10. Thus, a substantial length of each of second through electrodes 33 penetrating the stacked memory chips 31 may be determined according to the number of the stacked memory chips 31. That is, if the number of the stacked memory chips 31 increases, the vertical length of each of the second through electrodes 33 may also increase. Hence, when heat and pressure are applied to a top portion of a semiconductor chip stack 30 including the stacked memory chips 31 to connect and/or bond lower portions of the second through electrodes 33 to the first through electrodes 21 (see a combination portion of FIG. 13), vertical lengths of the second through electrodes 33, by which the heat and pressure are conducted, may become increased. Accordingly, as the number of the stacked memory chips 31 increases, it may become more difficult to achieve electrical and mechanical combinations/connections between the first through electrodes 21 and the second through electrodes 33 with reliability.

To obtain reliable combinations/connections between the first through electrodes 21 and the second through electrodes 33 even with increase of the number of the stacked memory chips 31, the heat energy and the pressure applied to the semiconductor chip stack 30 should also be increased. In this case, the memory chips 31 disposed adjacent to the top surface of the semiconductor chip stack 30 may be damaged due to the increased heat energy and the increased pressure. As a result, the semiconductor chip stack 30 may malfunction.

Alternatively, to obtain reliable combinations/connections between the first through electrodes 21 and the second through electrodes 33 even with increased numbers the stacked memory chips 31, it may be considerable to perform an electrical function test after the reliable combinations/connections whenever each of the stacked memory chips 31 is stacked with an adhesive agent 32 between the stacked memory chips 31. However, in this case, it may take a relatively long time to fabricate the semiconductor stack package. Thus, the fabrication cost of the semiconductor stack package may increase along with a degradation of throughput.

In contrast to the above comparative example described with reference to FIG. 13, the semiconductor stack package according to the embodiment illustrated in FIG. 8 may be fabricated by sequentially mounting the first to third chips 410, 450 and 470 (corresponding to memory chips) on one surface of the interposer 200 and by mounting the second semiconductor chip 600 (corresponding to a logic chip different from the first to third chips 410, 450 and 470) on the other surface of the interposer 200. Thus, when the second semiconductor chip 600 is mounted on the interposer 200, excessive heat energy and the excessive pressure may not be required.

Moreover, the second semiconductor chip 600 may be substantially mounted on the chip stack substrate 501 including the interposer 200 and the first protection layer 510, as described above. Accordingly, the first to third chips 410, 450 and 470 can be protected by the interposer 200 and the first protection layer 510 even while the second semiconductor chip 600 is mounted on the chip stack substrate 501. In contrast, the semiconductor chip stack 30 of the comparative example illustrated in FIG. 13 may be handled and/or transferred without any other substrate or any other support, such as a protection layer, while the logic chip 20 is combined with the semiconductor chip stack 30. Thus, the semiconductor chip stack 30 may be more readily damaged while the logic chip 20 is combined with the semiconductor chip stack 30 or while a subsequent function test is performed after combination between the semiconductor chip stack 30 and the logic chip 20. However, according to the example embodiment illustrated in FIGS. 2 to 12, the semiconductor chip stacks 400 may be completely surrounded by the interposer 200 and the first protection layer 510. Hence, the semiconductor chip stacks 400 may be electrically tested using the first through electrodes 210 that penetrate the interposer 200, and the semiconductor chip stacks 400 can be encapsulated by the interposer 200 and the first protection layer 510 even while the semiconductor chip stacks 400 are transferred or handled. Thus, the semiconductor chip stacks 400 may not be damaged while the chip stack substrate 501 are transferred or handled.

According to the descriptions to FIGS. 4 and 5, the first to third chips 410, 450 and 470 may be sequentially stacked on the interposer 200. However, the inventive concepts are not limited thereto. For example, the semiconductor chip stacks 400 may be primarily formed by sequentially stacking the first to third chips 410, 450 and 470 in a same or similar manner as the comparative example illustrated in FIG. 13, and the semiconductor chip stacks 400 may be then directly mounted on the interposer 200.

Figure 14:
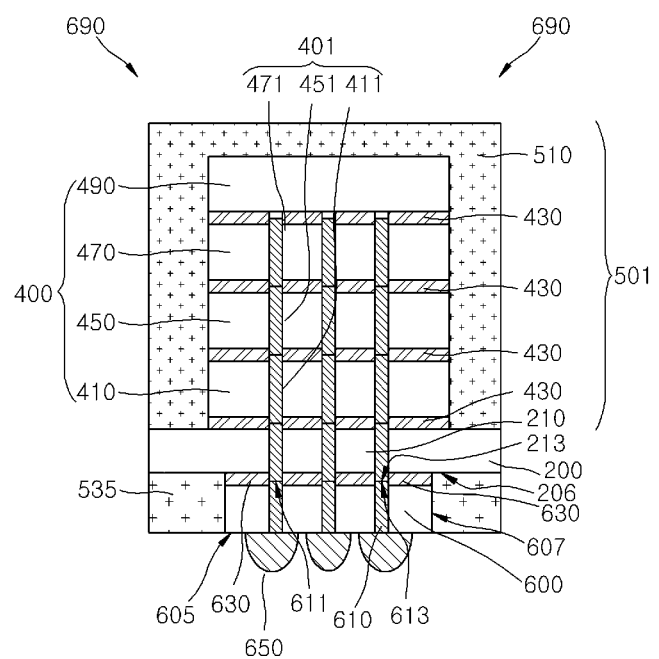
FIG. 14 is a cross sectional view illustrating semiconductor stack packages according to modified embodiments of the inventive concept and illustrating methods of fabricating the same.

FIG. 14 is a cross sectional view illustrating semiconductor stack packages according to modified embodiments of the inventive concept and illustrating methods of fabricating the same. These modified embodiments are similar to the previous embodiments described with reference to FIGS. 2 to 12. Thus, to avoid duplicate explanation, differences between the present modified embodiments and the previous embodiment illustrated in FIGS. 2 to 12 will be mainly described in detail hereinafter.

Referring to FIG. 14, a second protection layer 535 may be formed to cover entire sidewalls 607 of the second semiconductor chip 600 and to expose a top surface 605 of the second semiconductor chip 600. For example, the second protection layer 535 may be molded or deformed to have a flat surface exposing the top surface 605 of the second semiconductor chip 600.

According to the embodiment illustrated in FIGS. 2 to 12, each of the semiconductor chip stacks 400 may include three chips 410, 450 and 470 which are sequentially stacked. However, the inventive concept is not limited thereto. For example, according to the present modified embodiments illustrated in FIG. 14, each of the semiconductor chip stacks 400 may further include a fourth chip 490 stacked on the third chip 470 with the first intermediate insulation layer 430 between the third chip 470 and the fourth chip 490. The fourth chip 490 may be configured to not include any through electrodes penetrating a body thereof.

Figure 15:
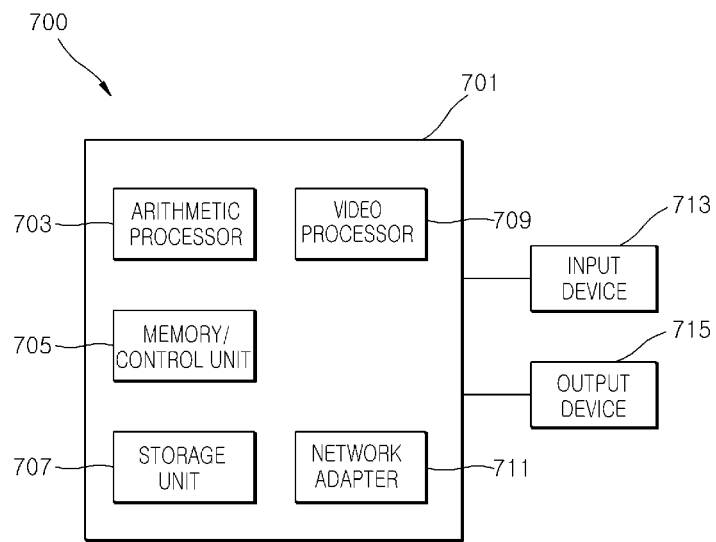
FIG. 15 is a schematic block diagram illustrating an example of electronic systems including semiconductor stack packages according to some embodiments.

FIG. 15 is a schematic block diagram illustrating an example of electronic systems including semiconductor stack packages according to some embodiments. The semiconductor stack packages according to the previously described embodiments may be employed in electronic systems 700, for example, computers, mobile phones or the like. The electronic system 700 may be configured to include a main board 701 and various electronic devices and/or packages mounted on the main board 701. The main board 701 may be a printed circuit board (PCB). At least one of the electronic packages may be realized using one of the embodiments described with reference to FIGS. 2 to 12, 14 and 15.

The electronic system 700 may include an arithmetic processor 703, a memory/control unit 705, a storage unit 707, a video processor 709 and a network adapter 711 that are mounted on the main board 701 to communicate with each other through a data bus (not shown). The arithmetic processor 703 may be a microprocessor, and the memory/control unit 705 may be a semiconductor stack package including memory chips such as DRAM chips and a logic chip that controls the operation of the memory chips. Further, the storage unit 707 may include a nonvolatile memory device and/or a hard disk, and the video processor 709 may be a semiconductor stack package including memory chips such as video DRAM chips for temporarily storing video data and a video controller for processing/controlling the video data stored in the video DRAM chips. In addition, the network adapter 711 may correspond to an interface unit. That is, the network adapter 711 may transmit electrical data to an external communication network or may receive electrical data from the eternal communication network.

Program data stored in the storage unit 707 may be loaded in the memory/control unit 705 through the data bus and may be executed by the arithmetic processor 703. In some embodiments, the storage unit 707 may be configured to include a solid state disk (SSD, also referred to as a solid state drive) having a plurality of flash memory devices. In addition, the electronic system 700 may further include an input device 713 for receiving data and an output device 715 for displaying data processed therein. The input device 713 may include a keyboard or a touch sensitive display screen, and the output device 715 may include a display monitor, a printer or a display screen. The electronic system 700 may correspond to a personal computer, a server or a mobile system. The mobile system may include a laptop computer, a handheld computer or a smart phone.

According to the embodiments set forth above, a plurality of first semiconductor chips may be sequentially stacked on a first surface of a substrate such as an interposer and at least one second semiconductor chip may be stacked on a second surface of the substrate opposite to the first surface. The second semiconductor chip may be different from the first semiconductor chip in function and/or in size. Accordingly, the aforementioned embodiments may address problems that occur when the second semiconductor chip and the first semiconductor chips are sequentially stacked only on one surface of the substrate.

Embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A method of fabricating a semiconductor stack package, the method comprising:
preparing an interposer in which a first through electrode is inserted, the first through electrode having a first contact portion exposed at a top surface of the interposer;
vertically stacking a plurality of first semiconductor chips on the top surface of the interposer to form a semiconductor chip stack connected to the first contact portion;
recessing a bottom surface of the interposer to expose a second contact portion of the first through electrode opposite to the first contact portion; and
stacking a second semiconductor chip on a bottom surface of the interposer to connect the second semiconductor chip to the second contact portion of the first through electrode,
wherein recessing the bottom surface of the interposer includes grinding, chemically and mechanically polishing or etching back the bottom surface of the interposer to expose a second contact portion of the first through electrode opposite to the first contact portion.

2. The method of claim 1, wherein preparing the interposer includes:
forming a groove that extends from the top surface of the interposer into a bulk region of the interposer; and
filling the groove with a conductive material to form a first through electrode.

3. The method of claim 1, wherein the semiconductor chip stack is formed to include a second through electrode that penetrates the plurality of first semiconductor chips to electrically connect the first semiconductor chips to each other, and the second through electrode is electrically connected to the first contact portion.

4. The method of claim 1, wherein stacking the plurality of first semiconductor chips includes:
preparing the plurality of first semiconductor chips, so that each of the first semiconductor chips being formed to include a partial through electrode penetrating a body thereof; and
sequentially stacking the plurality of first semiconductor chips on the interposer to electrically connect the partial through electrodes to each other,
wherein the partial through electrodes constitute a second through electrode.

5. The method of claim 1, wherein stacking the plurality of first semiconductor chips includes:
preparing the plurality of first semiconductor chips, so that each of the first semiconductor chips being formed to include a partial through electrode penetrating a body thereof;
sequentially stacking the plurality of first semiconductor chips to electrically connect the partial through electrodes to each other and to form a semiconductor chip stack; and
stacking the semiconductor chip stack on the interposer.

6. The method of claim 1, wherein recessing the bottom surface of the interposer further includes additionally recessing the bottom surface of the interposer such that a lower portion of the first through electrode protrudes from the recessed bottom surface of the interposer.

7. The method of claim 1, further comprising forming a first protection layer that covers the semiconductor chip stack, before the bottom surface of the interposer is recessed.

8. The method of claim 1, wherein the second semiconductor chip includes a third through electrode electrically connected to the second contact portion of the first through electrode.

9. The method of claim 1, further comprising:
   forming a second protection layer that covers the second semiconductor chip; and
   removing a portion of the second protection layer to form an opening that exposes a portion of the second semiconductor chip.

10. The method of claim 9, further comprising attaching an external electrode to the second semiconductor chip exposed by the opening.

11. The method of claim 1, further comprising forming a second protection layer that leaves exposed a surface of the second semiconductor chip opposite to the interposer and covers sidewalls of the second semiconductor chip.

12. A method of fabricating a semiconductor stack package, the method comprising:

preparing an interposer in which first through electrodes are inserted, each of the first through electrodes having a first contact portion exposed at a top surface of the interposer;

stacking a plurality of semiconductor chip stacks electrically connected to the first contact portions on the top surface of the interposer to be laterally spaced apart from each other;

forming a first protection layer that fills an empty space between the semiconductor chip stacks;

recessing a bottom surface of the interposer to expose second contact portions of the first through electrodes opposite to the first contact portions;

stacking a plurality of second semiconductor chips electrically connected to the second contact portions on a bottom surface of the interposer opposite to the semiconductor chip stacks; and removing a portion of the first protection layer between the semiconductor chip stacks and a portion of the interposer to separate a substrate including the semiconductor chip stacks and the second semiconductor chips into a plurality of semiconductor stack packages, wherein each of the semiconductor stack packages includes one of the semiconductor chip stacks, one of the second semiconductor chips, and a portion of the interposer between the semiconductor chip stack and the second semiconductor chip.

\* \* \* \* \*